US012776780B2

(12) United States Patent
Sanson

(10) Patent No.: US 12,776,780 B2
(45) Date of Patent: Oct. 27, 2026

(54) ACCURATE SYNCHRONOUS ANALOGUE COUNTER

(71) Applicant: LYNRED, Palaiseau (FR)

(72) Inventor: Eric Sanson, Veurey Voroize (FR)

(73) Assignee: LYNRED, Palaiseau (FR)

( * ) Notice: Subject to any disclaimer, the term of this patent is extended or adjusted under 35 U.S.C. 154(b) by 0 days.

(21) Appl. No.: 19/137,539

(22) PCT Filed: Dec. 5, 2023

(86) PCT No.: PCT/FR2023/051921
§ 371 (c)(1),
(2) Date: Jun. 10, 2025

(87) PCT Pub. No.: WO2024/134054
PCT Pub. Date: Jun. 27, 2024

(65) Prior Publication Data

US 2026/0205123 A1 Jul. 16, 2026

(30) Foreign Application Priority Data

Dec. 23, 2022 (FR) ...................................... 2214377

(51) Int. Cl.
*H03K 25/02* (2006.01)
*H04N 25/773* (2023.01)

(52) U.S. Cl.
CPC ........... *H03K 25/02* (2013.01); *H04N 25/773* (2023.01)

(58) Field of Classification Search
CPC ............................. H03K 25/02; H04N 25/773
See application file for complete search history.

(56) References Cited

U.S. PATENT DOCUMENTS 10,594,299 B1 3/2020 Veeder et al.
10,931,296 B2 2/2021 Boemler
2010/0213353 A1 8/2010 Dierickx
(Continued)

FOREIGN PATENT DOCUMENTS

WO WO-2021/150296 A1 7/2021

OTHER PUBLICATIONS

International Search Report and Written Opinion, corresponding International Application No. PCT/FR2023/051921, mailing date Feb. 8, 2024.

(Continued)

*Primary Examiner* — Patrick O Neill
(74) *Attorney, Agent, or Firm* — MARSHALL, GERSTEIN & BORUN LLP

(57) ABSTRACT

An analogue counter for counting the number of events in a logic input signal over a counting period comprising a set of detection cycles includes a circuit for periodically generating a calibrated quantity of charge for each detection cycle, an integration capacitor configured to store said calibrated quantity of charge over each detection cycle for which an event in the logic input signal is detected, a switching circuit for switching the calibrated quantity of charge, this circuit being controlled by the logic input signal to store the calibrated quantity of charge in the integration capacitor only when an event is detected, a circuit for generating control signals, and a reset circuit for resetting the output voltage across the terminals of the integration capacitor so as to reset the count.

10 Claims, 10 Drawing Sheets

(56) References Cited

U.S. PATENT DOCUMENTS

| | | | | |
|---|---|---|---|---|
| 2021/0226637 | A1 | 7/2021 | Wahl | |
| 2022/0272298 | A1* | 8/2022 | Pope | G01J 1/46 |

OTHER PUBLICATIONS

Berkovich et al., "A Low-Light SPAD Vision Array", 2014 IEEE International Symposium on Circuits and Systems (ISCAS), IEEE, Jun. 1, 2014 (Jun. 1, 2014), XP032624640 (2014).

Lu et al., "A Compact SPAD Pixel with Active Quenching and Recharging", 2019 China Semiconductor Technology International Conference (CSTIC), IEEE, Mar. 18, 2019 (Mar. 18, 2019), XP033573712 (2019).

* cited by examiner

State of the Art

ACCURATE SYNCHRONOUS ANALOGUE COUNTER

TECHNICAL FIELD

The invention concerns a counter enabling to count a number of events detected on a logic input signal, that is, an input signal capable of taking two voltage states. The invention aims at an "analog" counter since the output is delivered in the form of an analog signal, so that each voltage level of the analog output signal represents an output number of the counter.

The invention more specifically concerns a "synchronous" analog counter, that is, an analog counter for which the detection of events on the logic input signal is synchronized with a clock.

The invention more particularly aims at obtaining a highly-accurate synchronous analog counter, in that it does not depend at the first order on the technological parameters of the technology used, such as the transistor threshold voltage dispersion, or on the capacitance value.

Thus, the invention may apply in a large number of technical fields for which it is desired to perform a counting with a limited surface area of implantation of the circuit achieving this counting function, and for example for single-photon avalanche photodiodes, also called SPAD, analog-to-digital converters, or neural networks.

BACKGROUND

To obtain an implantation of an electronic circuit having a limited surface area, it is known to use the CMOS, for "Complementary metal-oxide-semiconductor", technology.

In this CMOS technology, a logic counter is generally implemented by logic functions, for example D-type logic flip-flops. For an N-bit logic counter, N flip-flops are conventionally necessary to implement a logic counter capable of counting to $2^N$. Further, a storage of the count is also necessary, for example by means of a register also integrating N flip-flops. The silicon surface area necessary to implement a logic counter is thus proportional to the necessary number of flip-flops, and this surface area cannot be decreased.

In certain specific cases, the silicon surface area is limited, for example if the counter has to be implanted in a pixel within an array of defined dimension. If this surface area is not sufficient to implement a logic counter with the expected accuracy, it is possible to seek to implement an analog counter.

Indeed, the logic functions store the information on two logic levels, 0 and 1. Another possible solution is to store the information in the form of an analog voltage with M possible levels. Thus, with a capacitor capable of storing M distinct quantities of charge, and thus of having M distinct voltage levels between its terminals, it is possible to replace N flip-flops conventionally used to obtain a counter a logic output enabling to count to $2^N$. For this purpose, the number of charges to be counted M capable of being stored in the capacitor should be selected so that this number of charges M is smaller than or equal to number $2^N$.

A second capacitor can also store the result of the counting by transferring the charges from the first to the second capacitor, to replace the N other flip-flops of the register. With an analog counter, it is thus possible to limit the implantation surface area.

A logic counter thus has a counting dynamic range limited to $2^N$. An analog counter has a counting dynamic range limited by its accuracy which enables it to distinguish M different voltage levels at the output. By analogy, it is current to speak of an N-bit analog counter when its accuracy enables to fulfill the function of logic counters having a number of bits smaller than or equal to N.

An analog counter conventionally integrates an electronic counting circuit and a circuit for generating the signals for controlling the counter. The electronic circuit enables to convert the number of events detected during a counting period into an equivalent voltage, with a sufficient accuracy for the M different levels.

The events may correspond to rising or falling edges of a logic input signal. Further, the events may correspond to a variation in the logic state of an input signal. For example, by using a logic input signal normally in the high state, it is possible to detect events for which the logic input signal is placed in the low state. For this purpose, it is possible to implement detection cycles in the counting period, and to verify the logic state of the logic input signal at each detection cycle. Thus, the logic counter is incremented at each detection cycle for which an event of the logic input signal is detected, for example a low state on the logic input signal.

In the case of an analog counter, the incrementation of the logic counter results in an increase or a decrease of the output voltage.

For this purpose, analog counters use a charge transfer to an integration capacitor across which the output voltage is measured.

For example, in scientific publication "An analog counter architecture for pixel-level ADC", Peizerat, Arnaud et al. (2009), an electronic circuit illustrated in FIG. 1 of the state of the art provides using a CMOS capacitor Cinj to periodically inject charges into an integration capacitor Cint.

Output voltage Vint is measured across this integration capacitor Cint. CMOS capacitor Cinj is formed by means of a PMOS transistor, having its gate voltage set to a voltage Vbias. The source of this transistor Cinj is connected to the drain of a charge transistor Mc while the drain of this transistor Cinj is connected to the source of a transfer transistor Mt. Charge transistor Mc is also connected by its source to a bias voltage Vdd while the drain of transfer transistor Mt is connected to output voltage Vint.

The gate of the two transistors Mc, Mt is controlled by clock signals ϕ, /ϕ in phase opposition to charge CMOS capacitor Cinj when charge transistor Mc is on and transfer transistor Mt off; and to transfer charges from CMOS capacitor Cinj to integration capacitor Cint when charge transistor Mc is and transfer transistor Mt on.

This electronic circuit of FIG. 1 thus performs a charge transfer from CMOS capacitor Cinj to integration capacitor Cint at each cycle of clock signals ϕ, /ϕ. More specifically, at each cycle, the transferred charges pass through a transfer transistor Mt and they correspond, at the first order, to Vdd-Vbias-Vt, Vt corresponding to the threshold voltage of the PMOS transistor forming CMOS capacitor Cint.

Now, this PMOS transistor inevitably integrates a dispersion of its threshold voltage Vt. Other charge transfer schemes exist in the state of the art but they are also affected by the dispersions of Vt of the charge or transfer transistors.

This dispersion of threshold voltage Vt is mainly inherent to the manufacturing method. It can be estimated by Monte-Carlo-type simulations. More specifically, this dispersion is a function of the manufacturing factory, of the manufacturing batch, of the manufactured wafer, of the chip on the wafer . . . There also exists a local dispersion having a value inversely proportional to the square root of the transistor surface area. This dispersion may be of several millivolts, or of several tens of millivolts and causes a variation in the behavior of a counter with respect to another neighboring counter, for example when a plurality of counters are associated with a plurality of pixels.

Due to the dispersion of threshold voltage Vt, each analog counter of an array has its own transfer curve describing the variation of the output voltage according to each detected event.

If this transfer curve is different from one counter to the other, it is necessary to decrease the counting dynamic range to tolerate the error margin between the different curves, or to measure each of the curves to correct their errors to increase the accuracy.

In practice, it is very difficult to perform a personalized correction for each pixel, and the reducing of the counting dynamic range is conventionally used, whereby it is difficult to form an analog counter of more than 3 bits.

The dynamic range of an analog counter results from the accuracy of each voltage increment to pass from one level to the next level during the counting, but also from the accuracy of the increment of a counter with respect to the increment of each of the other counters present in each pixel of an array.

The state of the art of analog counters enables to form 3-bit counters. Some claim 4 counting bits with particularly complex architectures.

As an example, to form a 4-bit counter, and thus 16 distinct levels (15 increments) over a 3V voltage dynamic range, 0.2V voltage increments are necessary. To identify the output levels, the output voltage is recognized as representative of the level which is closest thereto, the threshold separating two successive levels is thus located in the middle of the two levels, that is, 0.1V away from the ideal level. The statistical difference of the output with respect to the ideal level follows a normal distribution. To avoid level detection errors over all the counters of an array having for example one million pixels, the threshold separating the levels has to be located at least at five times the standard deviation of the ideal level. The standard deviation of the statistical difference thus has to be in the order of 20 mV. The predominant source of the statistical error at the output is the statistical error on the increment. Indeed, this error on the increment is repeated during the counting, and cumulates at the output. The statistical error at the output is then equal M time the statistical error of the increment, M being the dynamic range of the counter. In the case of a 4-bit counter, the standard deviation of the error on the increment has to be 15 times smaller than the standard deviation of the output error, that is, a standard deviation of the error on the increment of 1.3 mV. This example illustrates the difficulty of forming a 4-bit analog counter with the dispersion of the threshold voltages Vt of the transistors formed in CMOS technology: from a few mV to some ten mV.

It should be noted that to increase by one bit the dynamic range of an analog counter, the accuracy of the increment has to be increased by a factor 4.

This issue of the dispersion of the threshold voltage Vt of a transistor linked to the charge transfer and requiring decreasing the accuracy is common to a large number of known analog input logic counters, particularly those described in documents US 2021/0226637, WO 2021/150296, U.S. Pat Nos. 10,931,296, and 10,594,299. This last document U.S. Pat. No. 10,594,299 clearly describes this accuracy limitation issue, and it provides increasing this accuracy by implementing a plurality of analog input logic counters in cascade. However, this solution requires managing carries between the counters in cascade and the reset signals during the counting. Further, the multiplicity of the analog input logic counters increases the implantation surface area.

Certain analog input logic counters also integrate amplifiers, such as described in an embodiment of scientific publication “A 64×64 SPAD-Based Indirect Time-of-Flight Image Sensor With 2-Tap Analog Pulse Counters”, Byungchoul Park and al. IEEE JOURNAL OF SOLID-STATE CIRCUITS (2021).

The use of this type of component poses power consumption problems. Indeed, the power consumption of an amplifier is in the order of 600 nA while a circuit which only uses discrete components, such as transistors, consumes ten times less current.

The technical problem of the invention thus is to obtain an analog counter with a higher accuracy than known counters of this type, allowing an implantation on a limited surface area, and having a limited electric power consumption.

SUMMARY OF THE DISCLOSURE

To address this technical problem, the invention provides implementing a circuit of periodic generation of calibrated charges and a charge switching circuit controlled by a logic input signal.

These circuits enable to periodically generate accurate charges during a detection cycle, and to switch the charges to an integration capacitor, across which the output voltage is provided, only when an event is detected in the detection cycle on the logic input signal.

There is meant by calibrated charge a charge which does not depend, at the first order, on the technological parameters of the CMOS technology. It will thus be preferably chosen to use a same type of capacitor for the injection capacitor and the integration capacitor so that the dispersions of this type of capacitor compensate for each other, and that the voltage increment on the integration capacitor is not affected by the dispersions of the capacitors between the different batches, wafers, or manufactured chips.

More specifically, the invention provides a circuit for periodically generating calibrated charges implementing a single injection control transistor series-connected with an injection capacitor, so as to use this injection control transistor to charge and discharge the injection capacitor. For this purpose, an initialization phase, a precharge phase, and a charge phase are implemented in each detection cycle. During the precharge and charge phases, the gate voltage of the injection control transistor is adjusted differently so as to apply two different successive voltages to the injection capacitor and, thus, cancel the threshold voltage of the injection control transistor by the difference between the two voltages successively applied to the injection capacitor.

As a result, accurately calibrated charges are periodically identically generated and transmitted to the switching circuit which has the function of selecting those which will be taken into account for the counting of each event. It thus becomes possible to improve the accuracy of the counter of the invention since the increment of the output signal between two consecutive counting levels may be much lower than that of the state of the art.

For example, the invention enables to implement an increment of the output signal in the order of from 0.015 to 0.025 Volt between two voltage levels, enabling to obtain a counting with an accuracy that may range up to 7 or 8 bits.

For this purpose, the invention concerns an analog counter of the number of events of at least one logic input signal over a counting period, said counting period comprising a set of detection cycles during which an event in the logic input signal can be detected.

The invention is characterized in that the analog counter comprises:

- a circuit for periodically generating a calibrated quantity of charge at each detection cycle;
- an integration capacitor configured to store said calibrated quantity of charge at each detection cycle of the counting period for which an event in the logic input signal is detected so that an output voltage, across the integration capacitor, is representative of the number of events of the logic input signal detected during the counting period;
- a circuit for switching the calibrated quantity of charge controlled by the logic input signal to store said calibrated quantity of charge into the integration capacitor only when an event is detected on the logic input signal;
- a circuit for generating control signals of the analog counter; and
- a circuit for resetting the output voltage across the integration capacitor so as to reset the counting.

The circuit for periodically generating calibrated charges comprises:

- an injection capacitor configured to store the calibrated quantity of charge at each detection cycle and connected at one of its terminals to a first bias voltage;
- an injection control transistor having its source connected to the other terminal of the injection capacitor, having its gate connected to a control voltage, and having its drain connected to an injection node;
- a charge transistor having its source connected to a second bias voltage and having its drain connected to the injection node; and
- a transfer transistor having its source connected to the injection node and having its drain connected to a switching node;
- the gate of the two charge and transfer transistors being controlled by clock signals in phase opposition so as to charge said injection capacitor and then to transfer the charges accumulated in said injection capacitor to the switching circuit.

The control signal generation circuit is configured to control the control voltage and the clock signals so as to successively generate the following phases at each detection cycle:

- an initialization phase during which the injection control transistor and the charge transistor are on while the transfer transistor is off;
- a precharge phase during which the injection control transistor and the transfer transistor are on while the charge transistor is off, the control voltage being set to a first value; and
- a charge phase during which the injection control transistor and the transfer transistor are on while the charge transistor is off, the control voltage being set to a second value.

The invention thus provides periodically generating a calibrated quantity of charge so that these charges can be transferred into the integration capacitor according to the switching controlled by said at least one logic input signal.

In the sense of the invention, the "calibrated" charges correspond to quantities of charge which are more accurate than those of the state of the art. Indeed, using the same injection control transistor to generate the two precharge and charge phases with distinct control voltages, the voltage applied across the integration capacitor at the end of these two phases is independent of the threshold voltage of this injection control transistor.

The quantity of charge in the integration capacitor depending on the capacitance value and on the voltage difference across the integration capacitor, the quantity of charge which is transferred from the injection capacitor to the integration capacitor is thus more accurate since it is independent, at the first order, of variations in this threshold voltage.

Numerically, with a first control voltage value vtx1, a second control voltage value vtx2, and a threshold voltage of the injection control transistor vtMct, the voltage applied to a terminal of the integration capacitor corresponds to difference vtx1−vtMct in the precharge phase and to difference vtx2−vtMct in the charge phase. During the transition between these two phases, the quantity of charge in the integration capacitor thus is (vtx2−vtx1).Cinj, with Cinj the value of the injection capacitance. Thus, the quantity of charge transferred from the injection capacitor to the integration capacitor during the transition between these two phases is independent of the threshold voltage of injection control transistor vtMct.

This operating principle is not challenged if the threshold voltage of the injection control transistor vtMct slightly varies, by bulk effect, with the biasing of the source of the injection control transistor, since the bulk effect does not depend on the dispersion of the threshold voltage of injection control transistor vtMct.

This advantage is very important since it enables to implement thresholds of the output signal at voltages in the order of from 0.015 to 0.025 Volt between two voltage levels, enabling to obtain a counting having an accuracy that can reach from 7 to 8 bits.

In the sense of the invention, the "charge" or "precharge" phases correspond to phases at the end of which an accurate quantity of charge is generated by the circuit for periodically generating calibrated charges and stored in the injection capacitor. These calibrated charges can be obtained by steps of charge or of discharge of the injection capacitor without changing the invention.

These charges are "periodically" generated since, for each detection cycle implementing the initialization phase, the precharge phase, and the charge phase, a calibrated quantity of charge is generated by the circuit for periodically generating calibrated charges and stored in the injection capacitor. During each of these detection cycles repeated in a loop all along the counting period, this calibrated quantity of charge may be transferred or not into the integration capacitor. This transfer is controlled by the detection of an event on at least one logic input signal.

The events may correspond to rising or falling edges of a logic input signal. Preferably, the events correspond to a variation in the logic state of an input signal. For example, by using a logic input signal, the stable state of which is the high state, it is possible to detect events for which the logic input signal is placed in the low state. For this purpose, it is possible to verify the logic state of the logic input signal at each detection cycle. Thus, the analog counter is incremented or decremented at each detection cycle for which an event in the logic input signal is detected, for example a low state on the logic input signal.

In the context of the invention, the incrementation of the analog counter results in an increase or a decrease of the output voltage across the integration capacitor obtained by a transfer of calibrated charges from the injection capacitor.

For this purpose, the switching circuit may take a plurality of distinct shapes with one or a plurality of transistors operating in switching mode to transfer the accurately-calibrated charges which are enabled by an event on the logic input, towards the integration capacitor, and to evacuate all other charges towards a bias voltage.

Preferably, the switching circuit comprises two lines:

- a charge evacuation line comprising an evacuation transistor having its source connected to said switching node and its drain connected to a third bias voltage; and
- a charge transfer line comprising a counting transistor having its source connected to said switching node and its drain connected to the integration capacitor;
- the gate of the transistors of the two lines being controlled by logic input signals which define whether the charges stored in the injection capacitor are evacuated or transferred to the integration capacitor.

Preferably, the on state of the two transistors will not occur in ohmic mode, but in saturated mode to ensure a cascode function during the charge transfer, and thus improve linearity.

With this switching circuit, the evacuation transistor of the charge evacuation line may be preferably controlled by a variable logic input signal while the counting transistor of the charge transfer line is controlled by a fixed signal, whereby parasitic charge couplings between the gate of the counting transistor and the integration capacitor are suppressed.

Thus, it is possible to ascertain that an event in the variable logic input signal in the charge phase causes a transfer of the calibrated charges into the integration capacitor. As a variant, the logic signals of the gates of the transistors of the two lines may be variable and correspond to two logic input signals so as to detect events on these two logic input signals.

Typically, the logic input signal applied to the gate of the counting transistor may be fixed, for example at a 2.4-Volt voltage. The voltage applied to the gate of the evacuation transistor may then be set to 2.7 Volts and decrease to 2.1 Volts during an event. Thus, the voltage applied to the gate of the evacuation transistor is normally more significant than the voltage applied to the gate of the counting transistor, and the calibrated charges are normally evacuated towards the third bias voltage. During an event, the voltage applied to the gate of the evacuation transistor is lower than the voltage applied to the gate of the counting transistor and the calibrated charges are transferred into the integration capacitor.

To detect events likely to appear on the logic input signal applied to the gate of the counting transistor, the latter may also vary between the 2.4-Volt voltage and the 3-Volt voltage.

Thus, an event in the logic input signal detected by the gate of the counting transistor causes an increase in the voltage applied to the gate of the counting transistor and, the voltage applied to the gate of the evacuation transistor being lower than the voltage applied to the gate of the counting transistor, the calibrated charges are transferred into the integration capacitor.

This embodiment is particularly efficient to easily control the counting or not of the events having occurred on a variable logic input signal, or a complemented equivalent logic input signal.

Further, with this switching circuit and considering the previous numerical example, the output signal thresholds may correspond to Vstep=(vtx2−vtx1).Cinj/Cint, with Cinj the injection capacitance value. More specifically, the value of the threshold voltage of injection control transistor vtMct may vary by bulk effect when the source-bulk voltage of injection control transistor Mct changes. The accurate charge is then slightly smaller than the theoretical value but this does not affect the accuracy of the reproducibility of the value since the contribution is of the second order. Typically, Vstep may be 23 mVolts over an 3-Volt amplitude range, extending from 1.4 to 4.4 Volts. It is thus possible to code 130 combinations on an analog output voltage, enabling to describe a signal over 7 bits of 128 combinations.

This switching circuit transfers calibrated charges to the integration capacitor, but it also transfers a small parasitic charge which is dependent on the threshold voltage difference between the evacuation transistor and the counting transistor.

Indeed, the transistors exchanging the cascode role, their common source connected to the switching node is biased either by the evacuation transistor, or by the counting transistor, to a value of their gate voltage minus the threshold voltage of each transistor. This threshold voltage difference between the evacuation transistor and the counting transistor is applied to the switching node during the switching, and thus to the parasitic capacitor seen by the switching node. Thus, this parasitic capacitor seen by the switching node corresponds to a parasitic charge proportional to the threshold voltage difference between the evacuation transistor and the counting transistor which is transferred to the integration capacitor.

This parasitic charge dependent on the threshold voltages between the evacuation transistor and the counting transistor is a second-order error since the parasitic capacitance of the switching node is much smaller than the injection capacitance, but this error becomes predominant in the context of the invention which has removed first-order errors.

To improve the accuracy of the analog counter and decrease the possible amplitude of the thresholds of the output signal, is may be sought to cancel the threshold voltage difference between the evacuation transistor and the counting transistor of the two lines of the switching circuit. For this purpose, it is possible to use a counter reset phase to store in an offset capacitor the threshold voltage difference between the two transistors of the two lines of the switching circuit. It is then possible to subtract this offset value stored in the offset capacitor to obtain the variable logic input signal from a controlled logic input signal. Thus, the charges transferred into the integration capacitor may be independent of the threshold voltage difference between the evacuation transistor and the counting transistor of the two lines of the switching circuit and the voltage thresholds of the output signal may be decreased, so as to increase the accuracy of the analog counter.

In this embodiment, the charge evacuation line also comprises:

- an offset capacitor connected between a controlled logic input signal and the gate of the evacuation transistor so that the variable logic input signal is obtained from the controlled logic input signal by applying an offset generated by the voltage of the offset capacitor;
- a first offset transistor assembled between the drain of the evacuation transistor and the third bias voltage, the source of the first offset transistor being connected to the third bias voltage, its drain being connected to the drain of the evacuation transistor and its gate being controlled by a first offset signal generated by the control signal generation circuit; and
- a second offset transistor assembled between the drain and the gate of the evacuation transistor, the drain of the second offset transistor being connected to the drain of the evacuation transistor, its source being connected to the gate of the evacuation transistor and its gate being controlled by a second offset signal generated by the control signal generation circuit.

The control signal generation circuit is then configured to control the first offset signal and the second offset signal so as to successively generate the following episodes in a reset period:

an episode of charge of the offset capacitor in which the first offset transistor is on and the second offset transistor is on;

an episode of discharge of the offset capacitor in which the first offset transistor is off and the second offset transistor is on, this discharge episode being maintained for a number of calibration cycles during which the initialization, precharge, and charge phases are implemented; and an episode of sampling of the offset capacitor in which the first offset transistor is off and the second offset transistor is off;

the controlled logic input signal being set to a reset voltage value during the charge, discharge, and sampling episodes.

The control signal generation circuit is also configured to control the first offset signal and the second offset signal so that the first offset transistor is on and the second offset transistor is off during the counting period.

To implement this embodiment, the control signal thus needs to correspond to a "controlled" logic input signal, that is, a logic signal generated by the control signal generation circuit.

During the reset period, to obtain a charging of the offset capacitor with a voltage representing the threshold voltage difference between the evacuation transistor and the counting transistor of the two lines of the switching circuit, it is necessary to set the controlled logic input signal to a predefined voltage.

This predefined voltage is applied to a first terminal of the offset capacitor while the second terminal of the offset capacitor is coupled to the third bias voltage, through the second offset transistor, which is turned on. The first offset transistor being initially on in the charge episode, the offset capacitor is then charged to its maximum charge. The first offset transistor is then turned off, the drain and the gate of the evacuation transistor become a floating node during the discharge episode, biased by the offset capacitor.

To calibrate the offset capacitor to the desired value, calibrated charges need to be generated by the circuit for periodically generating calibrated charges by implementing the initialization, precharge, and charge phases otherwise used during the discharge episode. Thus, by using a plurality of consecutive calibration cycles in the discharge episode, for example 5 cycles, it is possible to progressively discharge the offset capacitor to a final desired value which is representative of the threshold voltage difference between the evacuation transistor and the counting transistor of the two lines of the switching circuit.

This value is asymptotically reached since, in a first step, the calibrated charges pass through the evacuation transistor, and discharge the offset capacitor, this discharge lowers the gate voltage of the evacuation transistor down to its conduction threshold, that is, the time when the calibrated charges entirely pass through the second transistor. This conduction threshold on the gate of the evacuation transistor is representative of the threshold voltage difference between the evacuation transistor and the counting transistor.

To end this reset period, the second offset transistor is turned off to sample the desired value from the offset capacitor. Thus, in the sampling episode, the first offset transistor is turned on to return to the initial conditions. The gate of the evacuation transistor is then controlled with an offset which aligns the conduction threshold at the same value for all pixels, the parasitic charge of the switching node is then identical for all pixels, there is no more dependence to the threshold voltage difference between the evacuation transistor and the counting transistor.

Preferably, the analog counter of the invention is integrated in a pixel of an array in which each pixel incorporates an analog counter. For this purpose, each pixel needs control signals to operate properly. These signals may be bias signals, conventional logic signals taking the power supply level, logic signals with specific voltage levels for the "0" and the "1", and logic or analog signals which are dependent on the logic input which enables the counting . . . There may also be more complex signals such that the controlled input signal which needs to take three distinct voltage levels: a voltage level in the reset period and two voltage levels to enable or not the counting in the counting period.

If possible, all these signals are generated outside the pixel array, but the logic input signal is specific to each pixel, and it is thus generated in the pixel, it is for example the output of a comparator, or the two complemented outputs of a comparator. It is thus needed to have a circuit in the pixel to shape the control signals based on the input signal internal to the pixel. This circuit needs to be as small as possible since it is implanted in the pixel.

Thus, to optimize the surface area available for the analog counter, it is preferable to use identical control signals for a plurality of analog counters so that these control signals can be pooled and generated outside the surface of each pixel. For this purpose, it is possible to improve the charge evacuation line to set the voltage on the logic input signal in the reset period by external signals, generated in centralized fashion.

In this embodiment, the charge evacuation line also comprises a circuit for generating the variable logic input signal; this circuit comprising:

a first generation transistor having a first terminal, source or drain, connected to a first generation signal, a second terminal, source or drain, connected to the controlled logic input signal, and its gate connected to a non-controlled logic input signal; and a second generation transistor having a first terminal, source or drain, connected to a second generation signal, a second terminal, source or drain, connected to the controlled logic input signal, and its gate connected to a signal complementary to the non-controlled logic input signal.

The control signal generation circuit is configured to control the first generation signal and the second generation signal so that:

the first generation signal is in the low state in the charge phase and in the high state in the initialization and precharge phases of the counting period; and the second generation signal is in the high state in the initialization, precharge, and charge phases of the counting period;

the first generation signal and the second generation signal having a reset voltage during a reset period so as to bring the controlled logic input signal to the reset voltage during a reset period.

This embodiment aims at introducing a multiplexer with two transistors and two input signals, one for the "counting"

function and one for the "non-counting" function. One of these two signals is sent to the counter according to the positioning of the input signal which needs to remain stable during the counting, and may vary between two countings.

During the reset period, one of the two generation transistors is necessarily on, independently of the level of the non-controlled input signal, since the first generation transistor is controlled by the non-controlled logic input signal while the second generation transistor is controlled by the complementary signal. As a result, the desired voltage, that is, the reset voltage, is applied to the logic input signal during this reset period.

This embodiment may be implemented with or without the offset capacitor.

Thus, apart from the logic input signal, all the other signals are generated outside the array, in particular the specific voltage applied during the reset period. This however imposes for all the counters in the array to reset at the same time.

Further, it is possible to use the transfer transistor to ensure a cascode function with the injection control transistor. This cascode function enables to separate the injection node and the switching node to ensure a linearity of the charge transfer between the injection capacitor and the integration capacitor. For this purpose, the control signal generation circuit is configured to transmit a clock signal to the transfer transistor having its amplitude limited so that the transfer transistor is not in ohmic mode in the precharge and charge phases.

Further, the reset circuit may be formed by a transistor having its drain connected to the integration capacitor, its source connected to an initialization voltage, and its gate controlled by a reset signal generated by the circuit for generating control signals of the counter. This embodiment enables to simply implement a resetting of the voltage across the integration capacitor. In the sense of the invention, a resetting refers to a positioning of the analog output voltage to a value corresponding to value 0 of the event counter.

Thus, the resetting may comprise imposing a voltage level greater than 0 volt across the integration capacitor, for example 3 Volts. Preferably, the injection capacitor and/or the integration capacitor are formed by MOS capacitors. A capacitor MOS is conventionally formed by interposing a thin film of insulator of a few tens of nanometers between a semiconductor, for example silicon, and a metal electrode, for example made of polysilicon. This embodiment enables to limit the silicon surface area necessary to form the capacitors.

According to a first alternative implementation, the injection control transistor, the two transfer transistors, the evacuation transistor, and the counting transistor are formed of NMOS transistors, the first bias voltage and the second bias voltage corresponding to low voltage levels while the third bias voltage corresponds to a high voltage level. This first alternative implementation provides successive decreases of an output voltage, initially set to a high state.

According to a second alternative implementation, the injection control transistor, the two transfer transistors, the evacuation transistor, and the counting transistor are formed of PMOS transistors, the first bias voltage and the second bias voltage corresponding to high voltage levels while the third bias voltage corresponds to a low voltage level. This second alternative implementation provides successive increases of an output voltage, initially set to a low state.

BRIEF DESCRIPTION OF THE DRAWINGS

The way to implement the invention as well as the resulting advantages, will become apparent from the following embodiments, given as a non-limiting indication, in relation with FIGS. 1 to 8 in which.

DETAILED DESCRIPTION

Figure 1:
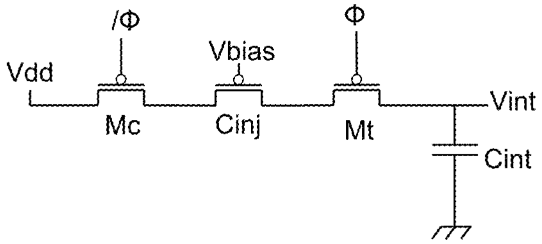
FIG. 1 is a simplified representation of an analog counter of the state of the art.
Figure 2:
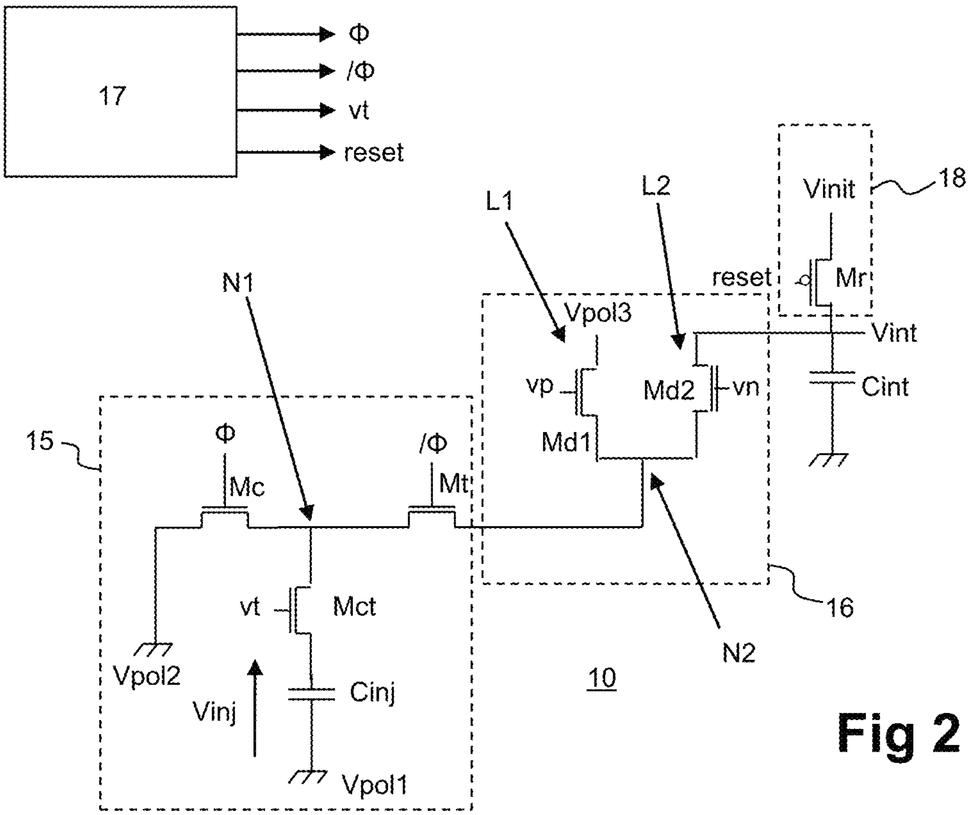
FIG. 2 is a simplified representation of an analog counter according to a first embodiment of the invention.

FIG. 2 illustrates an analog counter 10 according to an embodiment of the invention. Within this analog counter 10, an electronic circuit enables to count the number of events in a logic input signal vp or vn having occurred over a counting period Pc. For this purpose, the electronic circuit is divided into a plurality of parts:

- a circuit for periodically generating a calibrated quantity of charge 15,
- a switching circuit 16,
- a control signal generation circuit 17 and
- a reset circuit 18.

These different circuits 15 to 18 aim at controlling the storage of a predetermined quantity of charge in each detection cycle Cd of counting period Pc when an event is detected on logic input signal vp or vn. These calibrated quantities of charge are stored in an integration capacitor Cint assembled between an output voltage Vint and the ground.

Reset circuit 18 enables to reset the output voltage Vint across integration capacitor Cint by means of a signal reset. For this purpose, reset circuit 18 may be formed by means of a transistor Mr of PMOS type having its drain connected to voltage Vint and its source connected to an initialization voltage Vinit corresponding to the voltage to be applied to output voltage Vint to reset analog counter 10.

The gate of transistor Mr is controlled by a reset signal reset generated by control signal generation circuit 17. For example, voltage Vinit may correspond to a 3-Volt voltage enabling to reset voltage Vint across integration capacitor Cint to 3 Volts at the beginning of the counting. This reset circuit 18 may take other forms without changing the invention.

To generate calibrated charges at each detection cycle Cd, the invention provides implementing a circuit 15 for periodically generating a calibrated quantity of charge comprising an injection capacitor Cinj, an injection control transistor Mct, a charge transistor Mc, and a transfer transistor Mt. Injection capacitor Cinj, as well as integration capacitor Cint, may be formed by MOS capacitors. Conversely to integration capacitor Cint, which aims at storing a plurality of different quantities of charge to count the events having occurrents on logic input signal vp or vn, injection capacitor Cinj may have a capacitance value much lower than that of integration capacitor Cint. The order of magnitude of injection capacitance Cinj is some ten femtofarad, for example 10 fF, while the order of magnitude of integration capacitance Cint is some hundred femtofarad, for example 500 fF.

This injection capacitor Cinj is connected at one of its terminals to a first bias voltage Vpol1, while the other terminal of injection capacitor Cinj is connected to injection control transistor Mct. In the example of FIG. 2, injection control transistor Mct is formed of an NMOS transistor, having its source connected to injection capacitor Cinj while its drain is connected to an injection node N1. Further, the gate of injection control transistor Mct is connected to a control voltage vt generated by control signal generation circuit 17.

Injection node N1 is also connected to charge transistor Mc and to transfer transistor Mt. More specifically, charge transistor Mc is connected between injection node N1 and a second bias voltage Vpol2.

In the example of FIG. 2, charge transistor Mc is formed of an NMOS transistor having its source connected to the second bias voltage Vpol2, and having its drain connected to injection node N1. Transfer transistor Mt is connected between injection node N1 and a switching node N2. In the example of FIG. 2, transfer transistor Mt is formed of an NMOS transistor, having its source connected to injection node N1 and having its drain connected to switching node N2.

The two charge and transfer transistors Mc and Mt are controlled by clock signals ϕ and /ϕ in phase opposition. These clock signals ϕ and /ϕ are also generated by control signal generation circuit 17.

Thus, in the example of FIG. 2, control signal generation circuit 17 generates control signals ϕ, /ϕ, vt, and reset which enable to configure analog counter 10.

To detect events on a logic input signal vp or vn, this logic input signal is taken into consideration in switching circuit 16. This switching circuit 16 enables to transfer the calibrated charges of injection capacitor Cinj into integration capacitor Cint when the counting is enabled by logic input signal vp or vn or to evacuate its charges towards a third bias voltage Vpol3. For this purpose, switching circuit 16 preferably comprises two lines L1 and L2. One charge evacuation line L1 is formed by an evacuation transistor Md1. In the example of FIG. 2, evacuation transistor Md1 is formed of an NMOS transistor having its source connected to switching node N2 and having its drain connected to the third bias voltage Vpol3.

The second line corresponds to a charge transfer line L2 which comprises a counting transistor Md2. In the example of FIG. 2, counting transistor Md2 is formed of an NMOS transistor having its source connected to switching node N2 and having its drain connected to output voltage Vint, that is, to integration capacitor Cint.

The gate of transistors Md1 and Md2 is controlled by two logic input signals vp and vn which determine whether the charges stored in injection capacitor Cinj are evacuated or transferred into integration capacitor Cint. More specifically, these two logic input signals vp and vn operate as a differential pair, and the difference between these two logic input signals vp and vn determines whether the charges stored in injection capacitor Cinj are evacuated or transferred into integration capacitor Cint. Thus, by placing logic input signal vn to a fixed value, it is possible to define whether the charges stored in injection capacitor Cinj are evacuated or transferred, simply by modifying the state of logic input signal vp.

Figure 5:
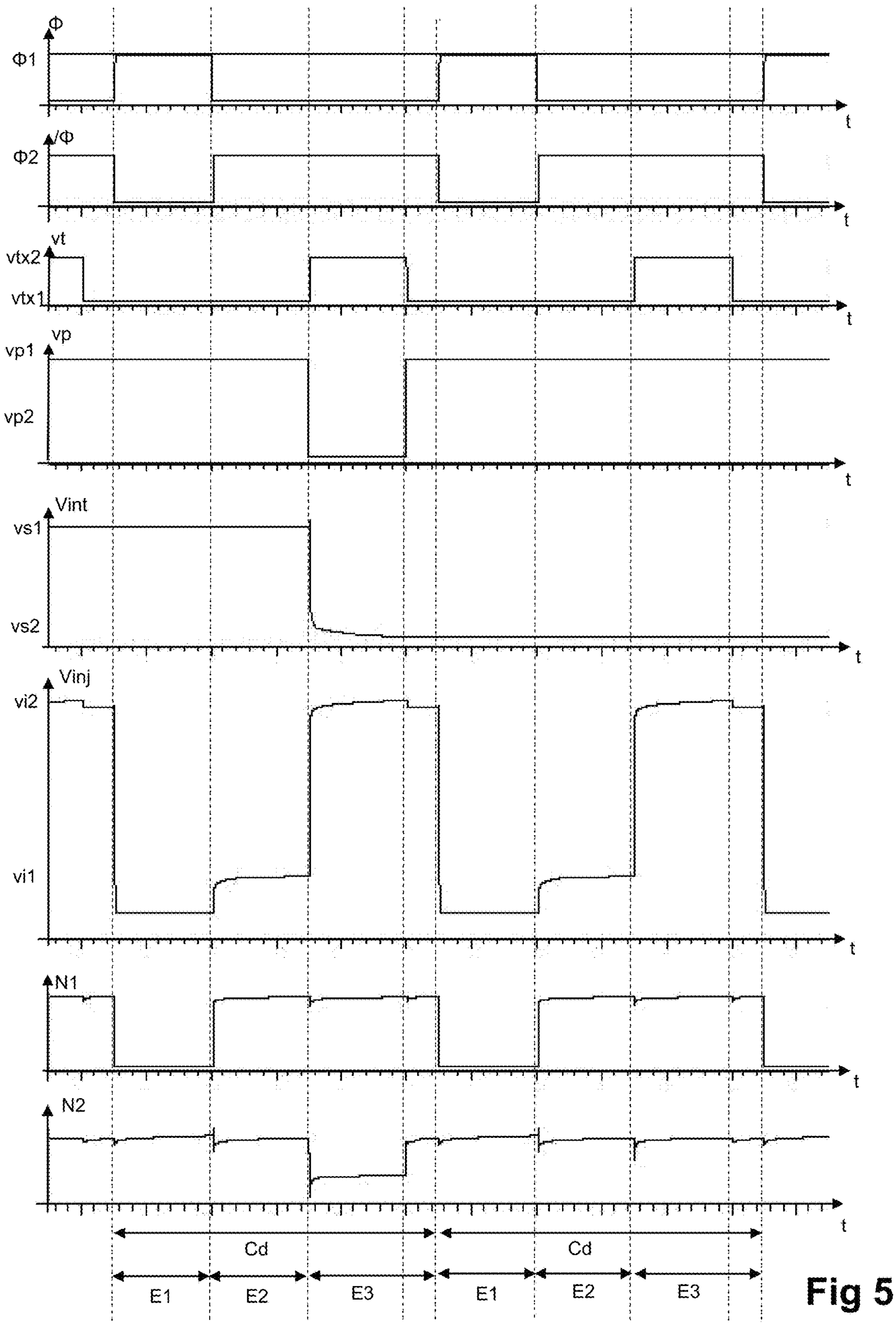
FIG. 5 is a simplified representation of the control signals and of the voltages of the analog counter of FIG. 2 according to a first time scale.

The operation of this circuit of FIG. 2 is more particularly described in relation with FIG. 5, which illustrates an example of implementation of two detection cycles Cd during a counting period Pc. Each detection cycle Cd comprises three phases.

One initialization phase E1 enables to charge injection capacitor Cinj. During this phase, injection control transistor Mct and charge transistor Mc are on while transfer transistor Mt is off. To control this initialization phase E1, clock signal ϕ is placed in the high state while clock signal /ϕ is placed in the low state. The duration of this initialization phase E1 is selected so that injection capacitor Cinj can be fully charged.

After this initialization phase E1, a precharge phase E2 consists in turning on injection control transistor Mct and transfer transistor Mt, while charge transistor Mc is turned off. Thus, this precharge phase E2 is obtained by switching signal ϕ to the low state and clock signal /ϕ to the high state. Further, in this precharge phase E2, control voltage vt is set to a first value vtx1. After this precharge phase E2, a charge phase E3 consists in changing control voltage vt to a second value vtx2 in order to apply a voltage discontinuity across injection capacitor Cinj.

This voltage discontinuity between precharge phase E2 and charge phase E3 causes a charge transfer controlled by the voltage variation applied to control signal vt.

More specifically, in precharge phase E2, capacitor Cinj progressively discharges until the voltage Vinj across this capacitor is biased to vtx1−vtMct, with vtMct corresponding to the threshold voltage of injection control transistor Mct. By applying a second voltage level vtx2>vtx1 during charge phase E3, capacitor Cinj discharges and signal Vinj transits from vtx1−vtMct to vtx2−vtMct, the quantity of transferred charges is then exactly vtx2−vtx1 divided by the capacitance value of capacitor Cinj.

The threshold voltage of injection control transistor vtMct slightly varies, by bulk effect, with the biasing of the source of injection control transistor Vinj, which effect very slightly decreases the value of the transferred charge with respect to theory, but the degradation of the accuracy of the transferred charge is of the second order.

In the example of FIG. 5, during first detection cycle Cd, signal vp transits from value vp1 to vp2 before control signal vt transits from value vtx1 to vtx2.

Thus, signal vp is in low state vp2 during the transition between precharge phase E2 and charge phase E3. This voltage level of logic input signal vp induces a counting, that is, a charge transfer from injection capacitor Cinj to integration capacitor Cint. As a result, the value Vint across integration capacitor Cint is decreased from voltage vs1 to voltage vs2 during this counting.

During the second detection cycle Cd illustrated in FIG. 5, when signal vt transits from voltage vtx1 to vtx2, no event appears on input signal vp and signal vp remains in the high state. As a result, the charges are evacuated towards third bias voltage Vpol3 and output voltage Vint does not change.

The voltage Vinj across injection capacitor Cinj well illustrates the two discharge phases of this injection capacitor with the voltage levels Vi1 and Vi2 which result from the precharge phases E2 and from the charge phases E3. Similarly, the voltage variation on injection and switching nodes N1 and N2 nodes also illustrates the variation of the voltage in the circuit of FIG. 2 according to whether there is or not a charge transfer from injection capacitor Cinj to integration capacitor Cint.

To ensure the necessary discharges of injection capacitor Cinj in the phases of precharge E2 and charge E3, and to ensure the accuracy of the charge transferred for the counting, the convergence time for the discharge of injection capacitor Cinj may be selected to be identical in the phases of precharge E2 and charge E3. This time is defined between the beginning of phase E2 and the time of switching of vp between vp1 and vp2.

Apart from the shape of the signals visible in this FIG. 5 and enabling to control the counter 10 of FIG. 2, it should be noted that the amplitude of clock signal /ϕ may also be set so that transfer transistor Mt ensures a cascode function with injection control transistor Mct. Thus, this transfer transistor Mt is not in ohmic mode. Typically, signal ϕ may vary between 0 and 5 Volts while signal /ϕ may vary between 0 and 2.1 Volts. Voltage vt may vary between voltage vtx1 in the range from 0.7 to 1.1 Volt and voltage vtx2 in the range from 1.5 to 1.9 Volts. By setting signal vn between 2.3 and 2.5 Volts, signal vp may vary in the high state between 2.6 and 2.9 Volts and in the low state between 1.9 and 2.2 Volts.

Of course, the diagram of FIG. 2 is illustrated with NMOS transistors and the first and the second bias voltage Vpol1 and Vpol2 are set to ground while the third bias voltage Vpol3 corresponds to a high voltage level, for example 5 Volts. As known in CMOS technology, it is possible to form an equivalent circuit by using PMOS transistors to form injection control transistor Mct, the two transfer transistors Mc and Mt, and the two transistors Md1 and Md2 of switching circuit 16. For this purpose, the first and the second bias voltage Vpol1 and Vpol2 correspond to high voltage levels while the third bias voltage Vpol3 is set to ground.

Figure 3:
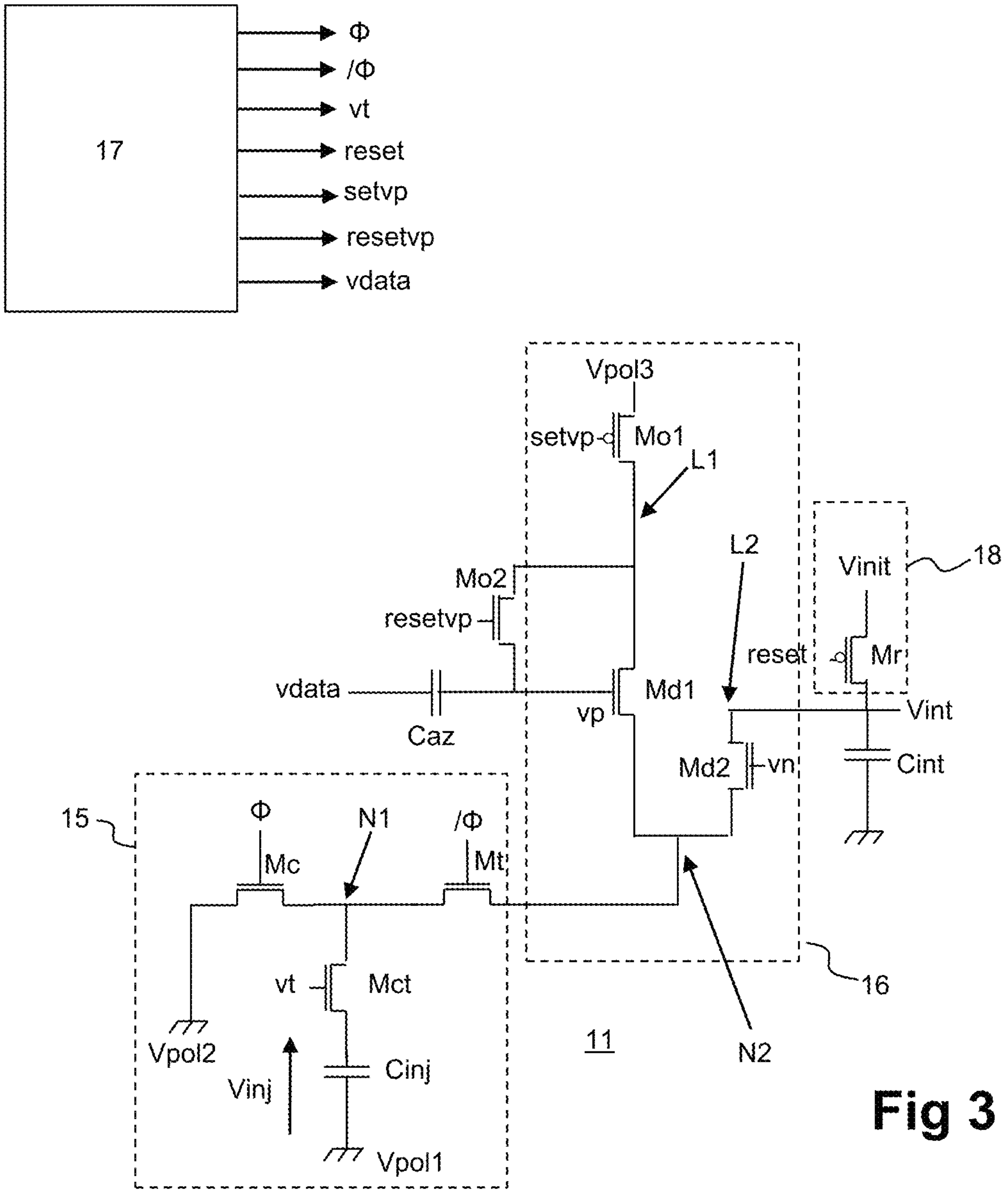
FIG. 3 is a simplified representation of an analog counter according to a second embodiment of the invention.
Figure 4:
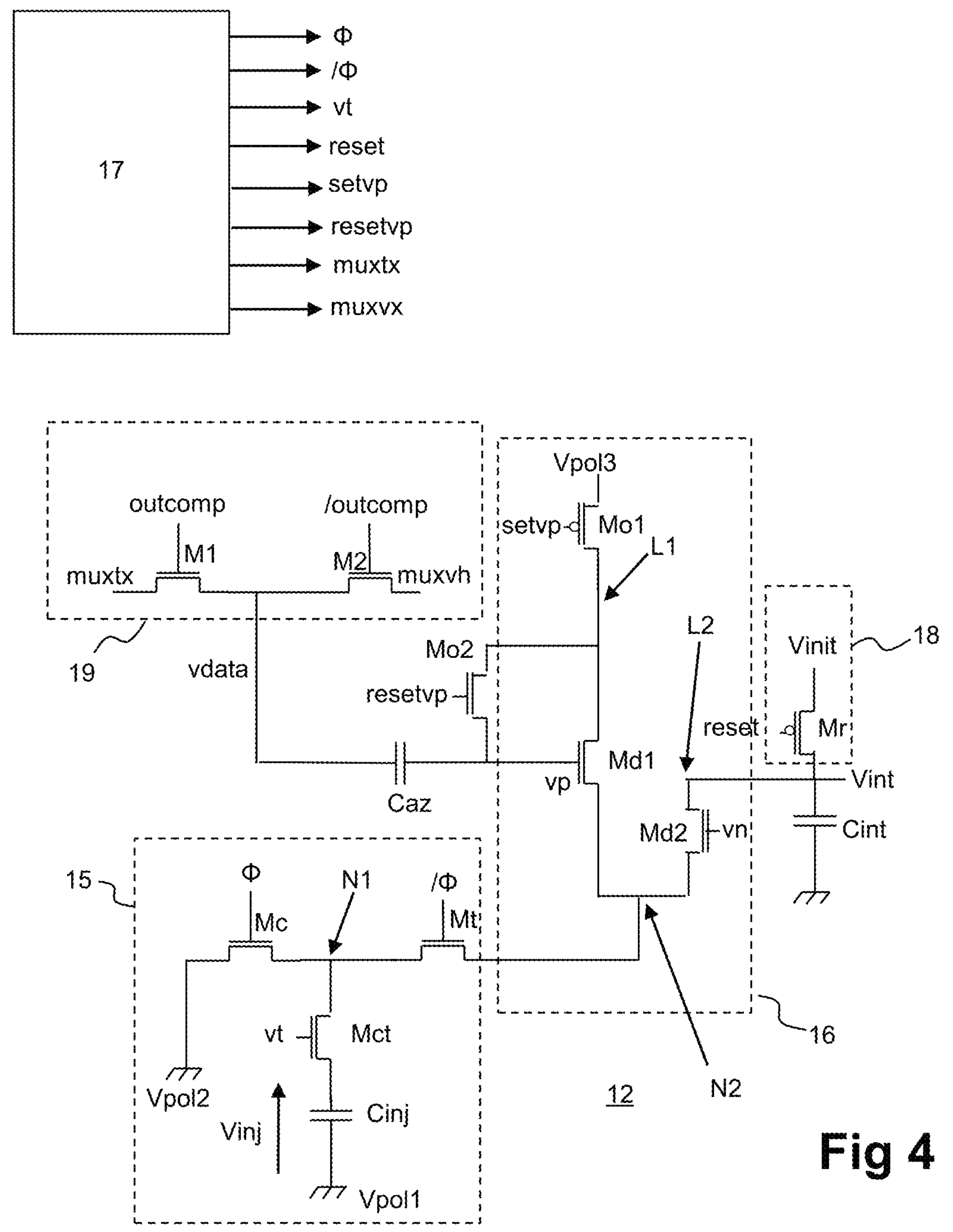
FIG. 4 is a simplified representation of an analog counter according to a third embodiment of the invention.

In addition to generic diagram of the invention illustrated in FIG. 2, a plurality of improvements to this diagram are possible and illustrated in FIGS. 3 and 4.

In the embodiment of FIG. 3, charge evacuation line L1 also comprises an offset capacitor Caz, a first offset transistor Mo1, and a second offset transistor Mo2. More specifically, offset capacitor Caz is connected between a controlled logic input signal vdata and the gate of evacuation transistor Md1. Thus, logic input signal vp is obtained from controlled logic input signal vdata by applying a fixed offset in offset capacitor Caz. The first offset transistor Mo1 is assembled between evacuation transistor Md1 and the third bias voltage Vpol3.

More specifically, in the example of FIG. 3, the first offset transistor Mo1 is formed of a PMOS transistor having its drain connected to the drain of evacuation transistor Md1, having its source connected to the third bias voltage Vpol3, and having its gate controlled by a first offset signal setvp generated by the control signal generation circuit.

The second offset transistor is assembled between the drain and the gate of evacuation transistor Md1. In the example of FIG. 3, the drain of the second offset transistor is connected to the drain of evacuation transistor Md1, and its source is connected to the gate of evacuation transistor Md1. The gate of this second offset transistor Mo2 is also controlled by a second offset signal resetvp generated by circuit 17.

Thus, in the embodiment of FIG. 3, circuit 17 also generates signals setvp, resetvp, and vdata since the voltage level of the controlled logic input signal vdata is to be controlled during a reset period Pr. This reset period Pr is implemented before counting period Pc, during which the multiple detection cycles Cd have been previously described.

In the example of FIG. 2, this reset period Pr simply consists in enabling signal reset for a time period sufficient to charge integration capacitor Cint to the initial value. With the circuit of FIG. 3, this reset period Pr may also be used to set the voltage across offset capacitor Caz by storing a predetermined quantity of charge in this offset capacitor Caz. This offset capacitor Caz is used to store a quantity of charge corresponding to the difference between the threshold voltages of transistors Md1 and Md2 so as to subtract this offset value to control the counting or not by input signal vp. Thereby, the offset of the differential pair formed by lines L1 and L2 can be canceled during counting period Pc.

For this purpose, reset period Pr comprises three distinct episodes: a charge episode P1, a discharge episode P2, and a sampling episode P3.

Figure 8:
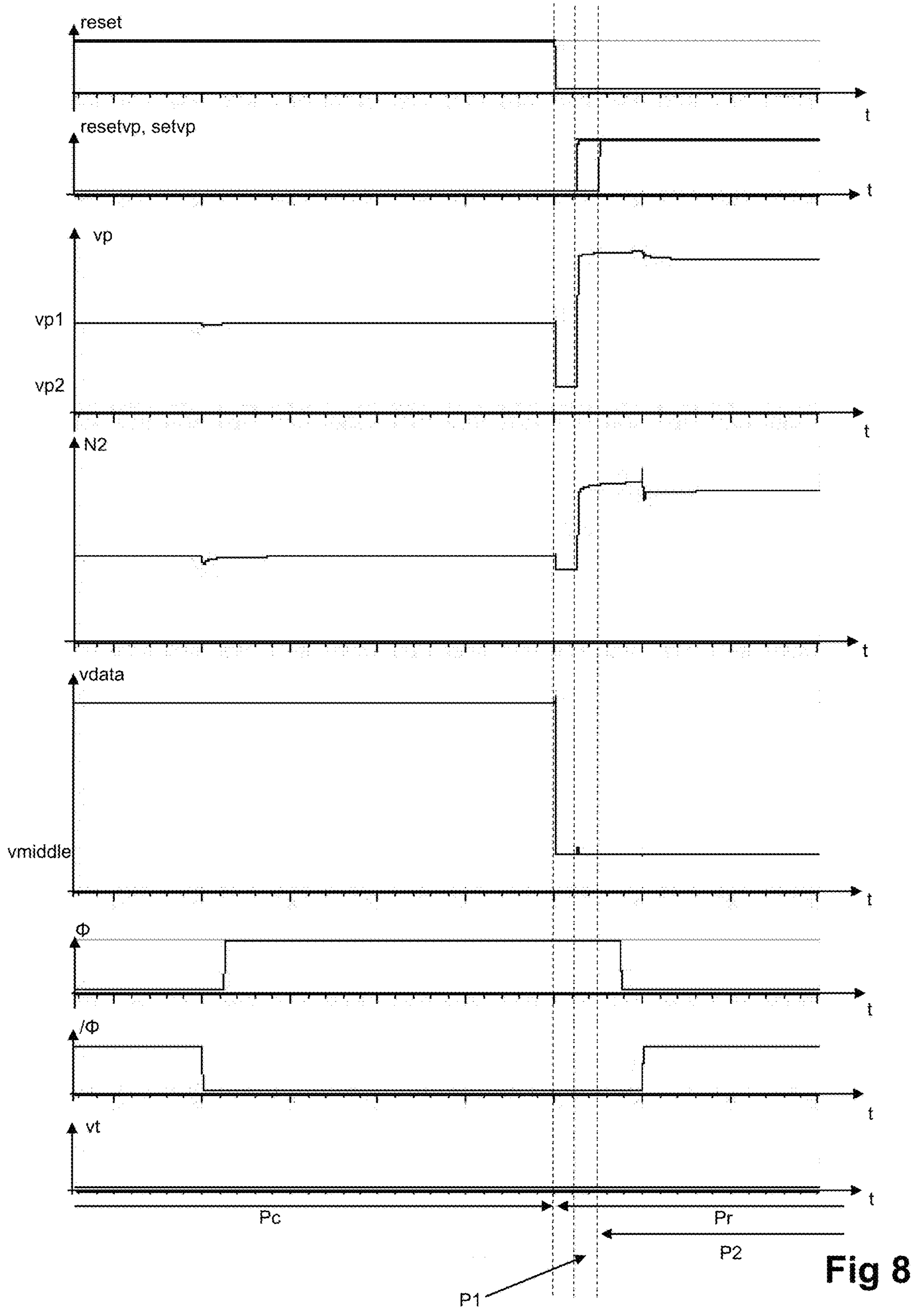
FIG. 8 is a simplified representation of a first part of the control signals and of the voltages of the analog counter of FIG. 4 in a charge episode of a reset period.
Figure 9:
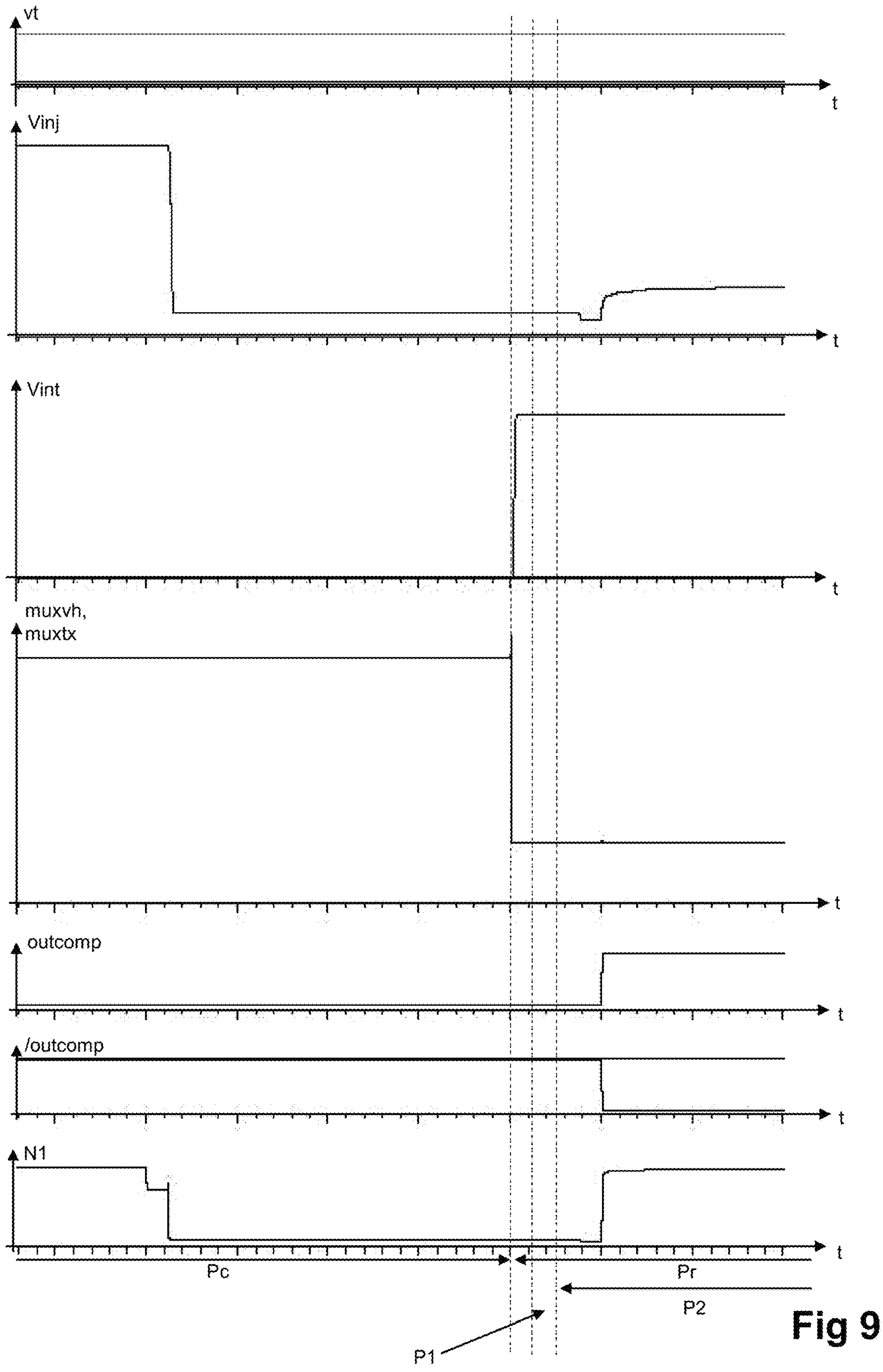
FIG. 9 is a simplified representation of a second part of the control signals and of the voltages of the analog counter of FIG. 4 in a charge episode of the reset period.

Charge episode P1 simply aims at charging offset capacitor Caz to a first initialization value. In this charge episode P1, such as illustrated in FIGS. 8 and 9, the first offset transistor Mo1 is on and the second offset transistor Mo2 is on.

Then, in discharge episode P2, the first offset transistor Mo1 is turned off while the second offset transistor Mo2 is on. This discharge episode P2 is maintained for a number of calibration cycles Cc during which the phases of initialization E1, precharge E2, and charge E3 are implemented.

During sampling episode P3, the first offset transistor Mo1 is off and the second offset transistor Mo2 is turned off.

To obtain a successive charge transfer from injection capacitor Cinj to offset capacitor Caz during reset period Pr, the controlled logic input signal vdata is set to a reset voltage value vmiddle. For example, voltage vdata may be set to a voltage in the range from 0.1 to 0.3 Volts.

Outside reset period Pr, during which charges are successively stored in offset capacitor Caz, signals setvp and resetvp are controlled so that the first offset transistor Mo1 is on and the second offset transistor Mo2 is off during the counting period.

To be able to manage the application of voltage vdata from signals common to an entire array of counters, the analog counter 11 of FIG. 3 may be improved with the diagram of the analog counter 12 of FIG. 4, in which a circuit for generating variable logic input signal 19 is provided.

This circuit 19 comprises a first generation transistor M1 and a second generation transistor M2 operating in switching mode. In the example of FIG. 4 implementing NMOS transistors, the first terminal, source or drain, of transistor M1 is connected to a first generation signal muxtx while the second terminal, source or drain, of this transistor M1 is connected to input signal vdata. The second terminal, source or drain, of transistor M2 is also connected to input signal vdata while its first terminal, source or drain, is connected to a second generation signal muxvh.

Input signal outcomp can thus be injected onto the gate of transistors M1 and M2; by using signal outcomp on the gate of transistor M1 and the inverse signal /utcomp on the gate of transistor M2.

In this embodiment, control signal generation circuit 17 generates signals muxtx and muxvh so as to place signal muxtx in the low state in charge phase E3 and in the high state in the phases of initialization E1 and precharge E2 of counting period Pc. Generation signal muxvh is placed in the high state during the phases of initialization E1, precharge E2, and charge E3 of counting period Pc. During reset period Pr, the first generation signal muxtx and the second generation signal muxvh are set to a specific voltage level vmiddle to position reset voltage vmiddle on logic input signal vdata.

Figure 6:
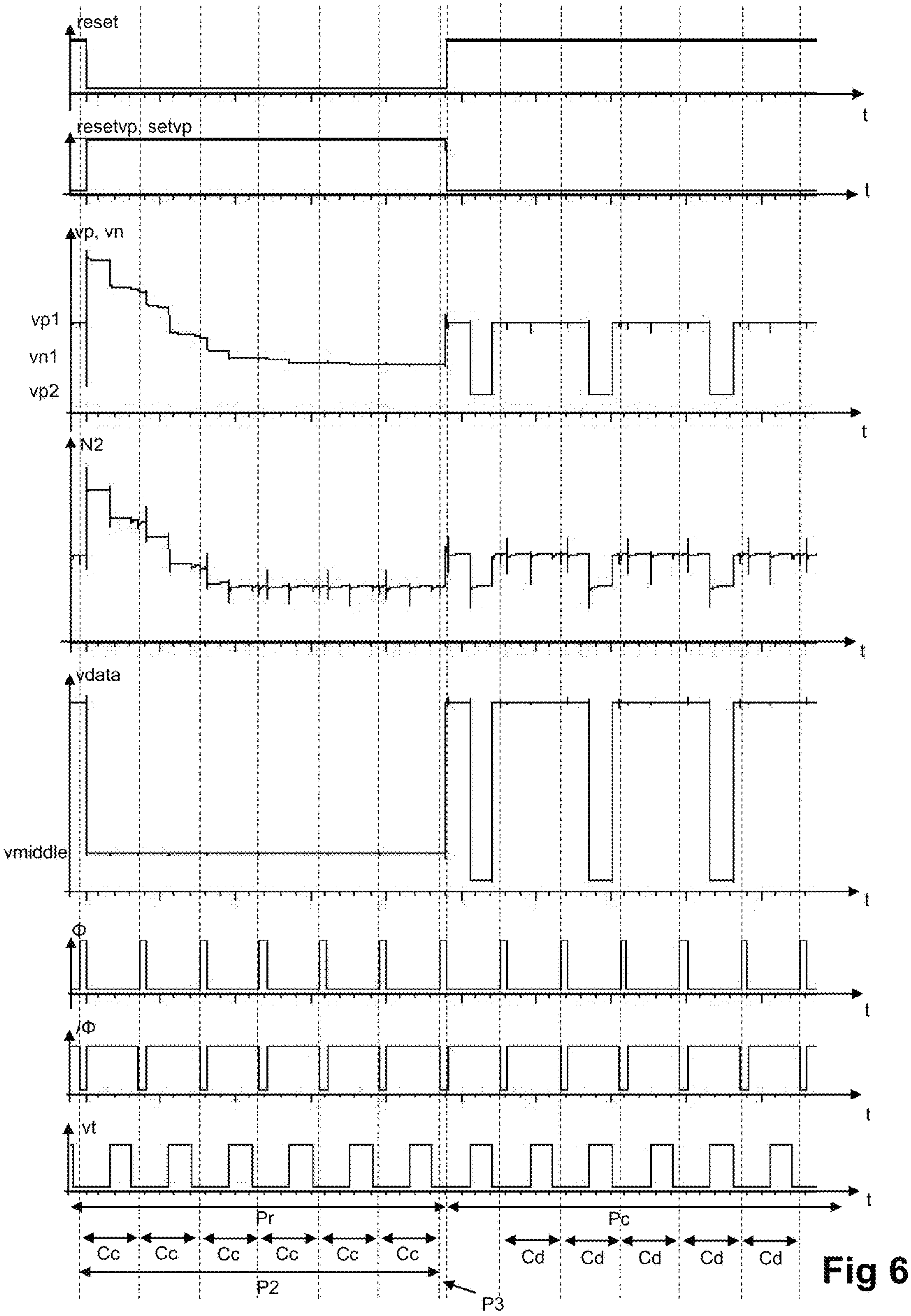
FIG. 6 is a simplified representation of a first part of the control signals and of the voltages of the analog counter of FIG. 4.
Figure 7:
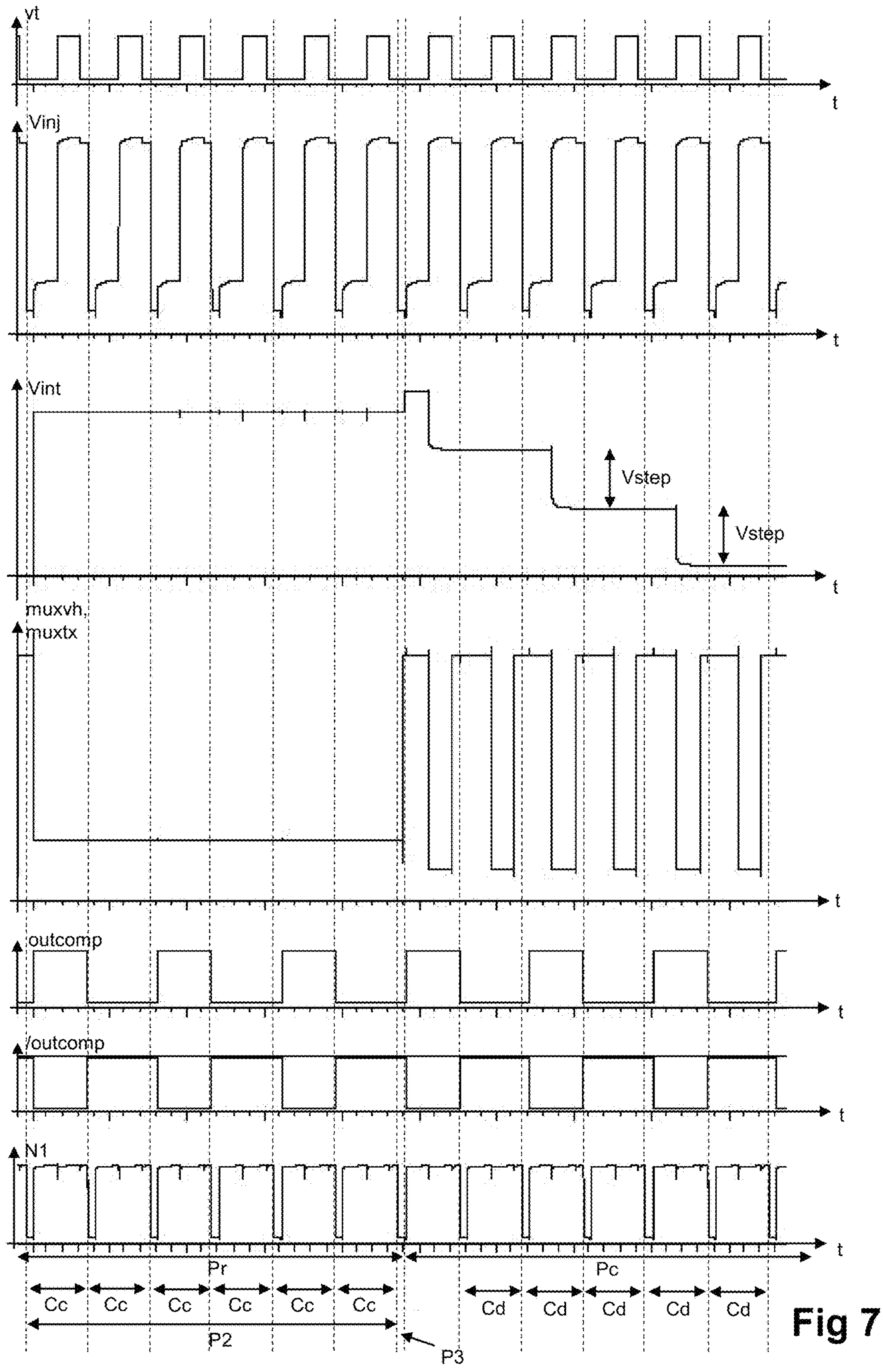
FIG. 7 is a simplified representation of a second part of the control signals and of the voltages of the analog counter of FIG. 4.

The transition between reset period Pr and counting period Pc is more particularly illustrated with the timing diagrams of the signals of FIGS. 6 and 7. These signals illustrate how the offset of signal vp varies along calibration cycles Cc, enabling the injection of the calibrated charges in injection capacitor Cinj towards offset capacitor Caz. After the six calibration cycles illustrated in FIGS. 6 and 7, voltage vp is nearly stable and this voltage vp has an offset of a few millivolts in counting period Pc. This offset is representative of the difference of the threshold voltages of transistors Md1 and Md2, it enables to cancel by subtraction, during counting period Pc, the degradation induced by this threshold voltage difference on the accuracy of the charge transferred into capacitor Cint.

Figure 10:
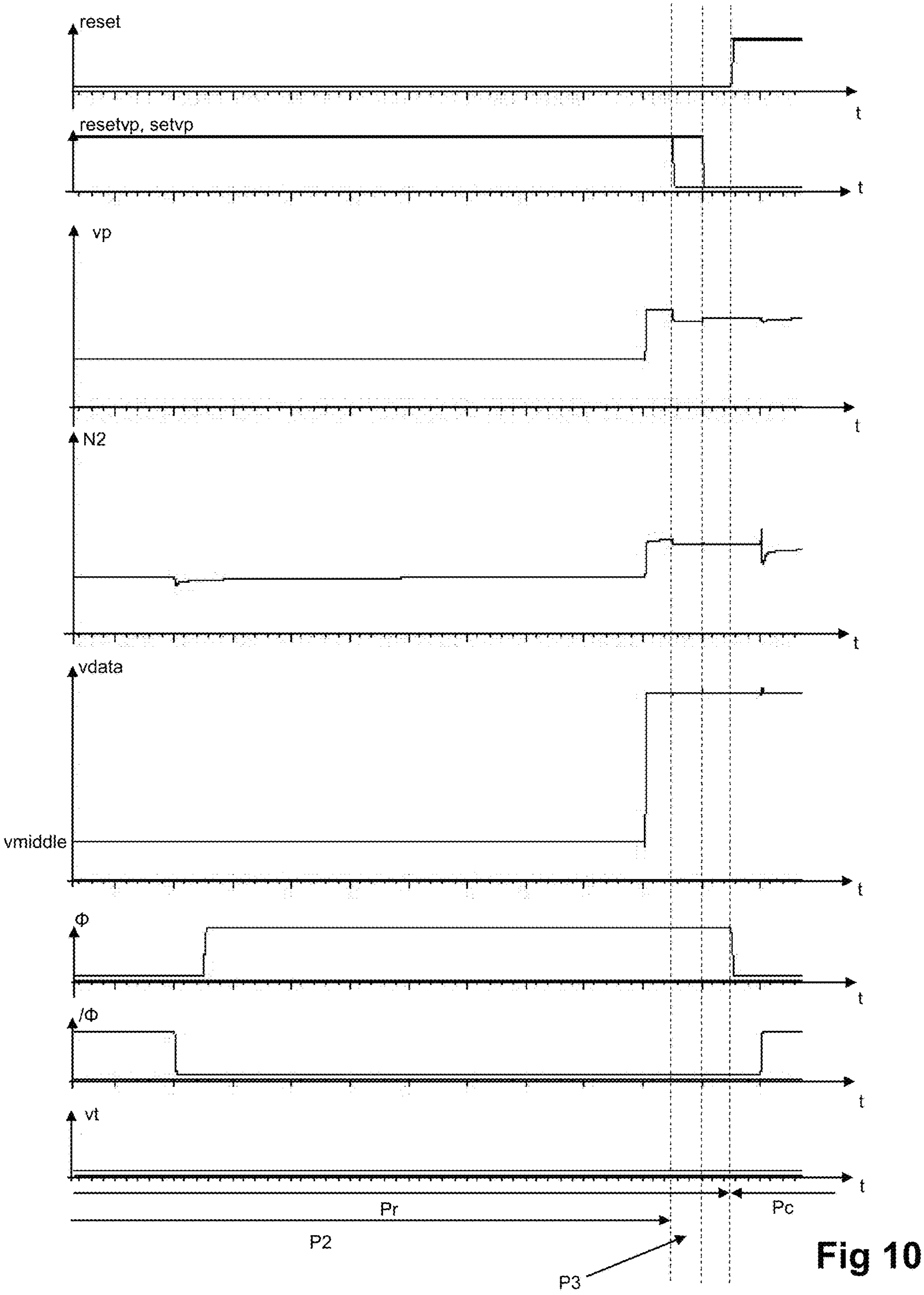
FIG. 10 is a simplified representation of a first part of the control signals and of the voltages of the analog counter of FIG. 4 in a sampling episode of the reset period.
Figure 11:
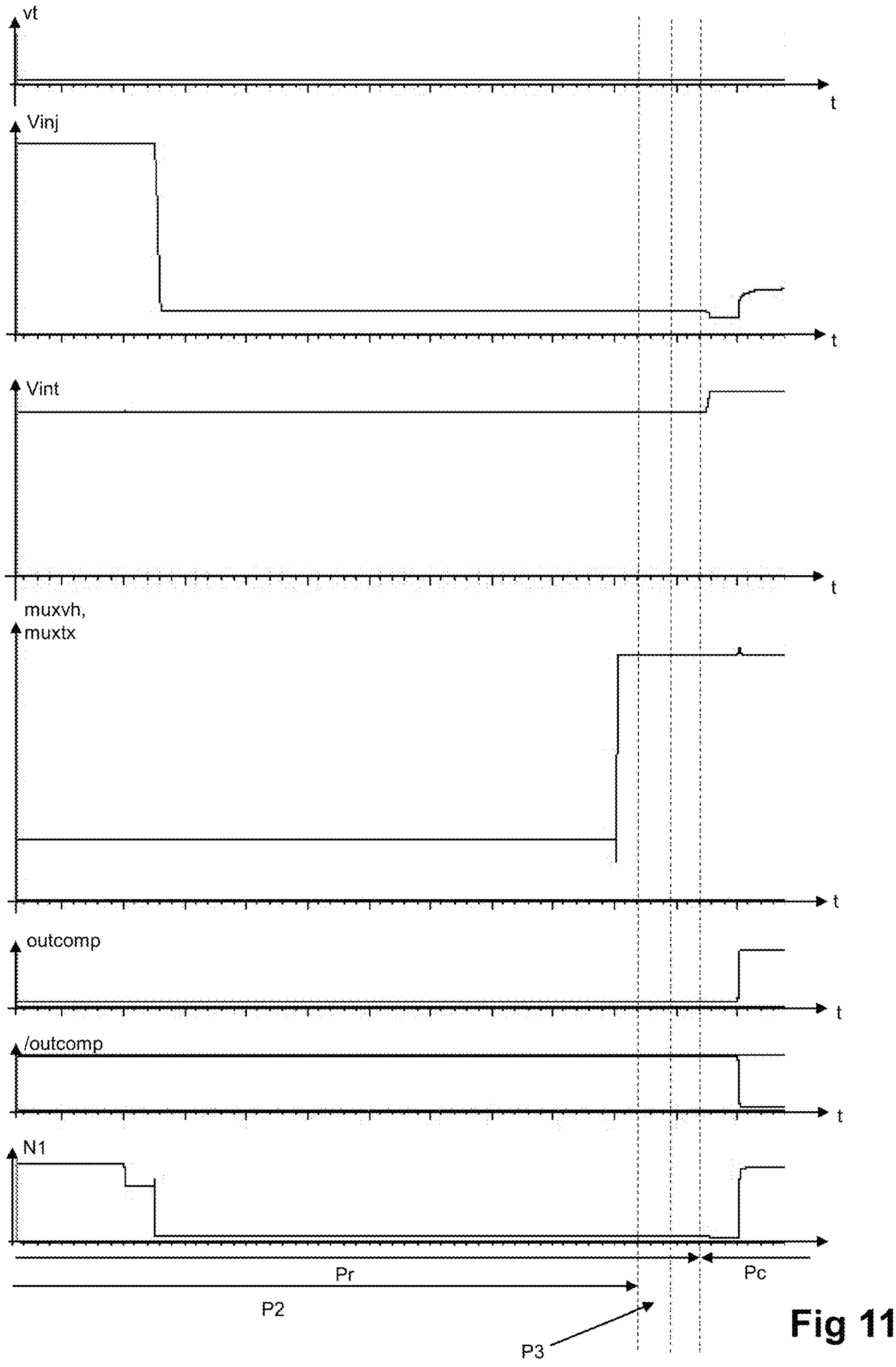
FIG. 11 is a simplified representation of a second part of the control signals and of the voltages of the analog counter of FIG. 4 in a sampling episode of the reset period.

As illustrated in FIGS. 6 and 7, calibration cycles Cc may have a duration substantially similar to that of detection cycles Cd and, thus, integrate the same phases E1 to E3. To form episode P3, such as illustrated in FIGS. 10 and 11, signals resetvp and setvp are not synchronized and there is a slight time delay to sample, in capacitor Caz, the value of the voltage vp obtained at the end of episode P2. This sampling is followed by the positioning of the voltages corresponding to counting period Pc.

Further, FIGS. 6 and 7 illustrate a plurality of detection cycles Cd during which input signal outcomp is activated. As a result, the output voltage Vint across integration capacitor Cint decreases a plurality of times in the timing diagrams of FIGS. 6 and 7. At each decrease of this voltage vp, a voltage difference Vstep is visible on output voltages Vint. This voltage difference can be particularly low with the invention, so as to obtain a 7- or 8-bit analog counter. Typically, this voltage difference Vstep may be in the range from 20 to 30 millivolts.

The invention thus enables to obtain an analog counter 10-12 more accurate than known analog counters since it does not depend at the first order on the technological parameters of the technology used, such as the dispersion of the transistor threshold voltages, or the capacitance values. Thus, the invention enables to obtain an analog counter 10-12 with an accuracy of 7 or 8 bits. Further, analog counter 10-12 may be formed with components CMOS allowing an integration of analog counter 10-12 in a restricted silicon surface area. Thus, the analog counter 10-12 of the invention can be integrated in each pixel of an array, for example for sensors using single-photon avalanche photodiodes.

The invention claimed is:

1. An analog counter of the number of events in at least one logic input signal over a counting period, said counting period comprising a set of detection cycles during which an event in the logic input signal can be detected, wherein the analog counter comprises:

- a circuit for periodically generating a calibrated quantity of charge for each detection cycle;
- an integration capacitor configured to store said calibrated quantity of charge during each detection cycle of the counting period for which an event in the logic input signal is detected so that an output voltage, across the integration capacitor, is representative of the number of events of the logic input signal detected during the counting period;
- a circuit for switching the calibrated quantity of charge controlled by the logic input signal to store said calibrated quantity of charge into the integration capacitor only when an event is detected on the logic input signal;
- a circuit for generating control signals of the analog counter;
- a circuit for resetting the output voltage across the integration capacitor so as to reset the counting;

the circuit for periodically generating a calibrated quantity of charge comprising:

- an injection capacitor configured to store the calibrated quantity of charge during each detection cycle and connected by one of its terminals to a first bias voltage;
- an injection control transistor having its source connected to the other terminal of the injection capacitor, having its gate connected to a control voltage, and having its drain connected to an injection node;
- a charge transistor having its source connected to a second bias voltage and having its drain connected to the injection node; and
- a transfer transistor having its source connected to the injection node and having its drain connected to a switching node;

the gate of the two charge and transfer transistors being controlled by clock signals in phase opposition so as to charge said injection capacitor, and then to transfer the charges accumulated in said injection capacitor to the switching circuit;

the control signal generation circuit being configured to control the control voltage and the clock signals so as to successively generate the following phases at each detection cycle:

- an initialization phase during which the injection control transistor and the charge transistor are on while the transfer transistor is off;
- a precharge phase during which the injection control transistor and the transfer transistor are on while the charge transistor is off, the control voltage being set to a first value; and
- a charge phase during which the injection control transistor and the transfer transistor are on while the charge transistor is off, the control voltage being set to a second value.

2. The analog counter according to claim 1, wherein the switching circuit comprises two lines:

- a charge evacuation line comprising an evacuation transistor having its source connected to the switching node and having its drain connected to a third bias voltage; and
- a charge transfer line comprising a counting transistor having its source connected to said switching node and having its drain connected to the integration capacitor;
- the gate of the transistors of the two lines being controlled by logic input signals which determine whether the charges stored in the injection capacitor are evacuated or transferred into the integration capacitor.

3. The analog counter according to claim 2, wherein the injection control transistor, the two transfer transistors, the evacuation transistor, and the counting transistor are formed of transistors NMOS, the first bias voltage and the second bias voltage corresponding to low voltage levels while the third bias voltage corresponds to a high voltage level.

4. The analog counter according to claim 2, wherein the injection control transistor, the two transfer transistors, the evacuation transistor, and the counting transistor are formed of transistors PMOS, the first bias voltage and the second bias voltage corresponding to high voltage levels while the third bias voltage corresponds to a low voltage level.

5. The analog counter according to claim 2, wherein the evacuation transistor of the charge evacuation line is controlled by a variable logic input signal, while the counting transistor of the charge transfer line is controlled by a fixed signal, so that an activation of the variable logic input signal in the charge phase causes a transfer of the calibrated charges into the integration capacitor.

6. The analog counter according to claim 5, wherein the charge evacuation line also comprises:

an offset capacitor connected between a controlled logic input signal and the gate of the evacuation transistor so that the variable logic input signal is obtained from the controlled logic input signal by applying an offset generated by the voltage of the offset capacitor;

a first offset transistor assembled between the drain of the evacuation transistor and the third bias voltage, the source of the first offset transistor being connected to the third bias voltage, its drain being connected to the drain of the evacuation transistor, and its gate being controlled by a first offset signal generated by the control signal generation circuit; and a second offset transistor assembled between the drain and the gate of the evacuation transistor, the drain of the second offset transistor being connected to the drain of the evacuation transistor, its source being connected to the gate of the evacuation transistor, and its gate being controlled by a second offset signal generated by the control signal generation circuit;

the control signal generation circuit being configured to control the first offset signal and the second offset signal so as to successively generate the following episodes in a reset period:

a charge episode of the offset capacitor during which the first offset transistor is on and the second offset transistor is on;

a discharge episode of the offset capacitor during which the first offset transistor is off and the second offset transistor is on, this discharge episode being maintained for a number of calibration cycles during which the phases of initialization, precharge, and charge are implemented; and a sampling episode of the offset capacitor during which the first offset transistor is off and the second offset transistor is off;

the controlled logic input signal being set to a reset voltage value during the charge, discharge and sampling episodes;

the control signal generation circuit being configured to control the first offset signal and the second offset signal so that the first offset transistor is on and the second offset transistor is off during the counting period.

7. The analog counter according to claim 2, wherein the charge evacuation line also comprises circuit for generating the variable logic input signal, the latter comprising:

a first generation transistor having a first terminal, source or drain, connected to a first generation signal, a second terminal, source or drain, connected to the logic input signal, and its gate connected to a non-controlled logic input signal; and a second generation transistor having a first terminal, source or drain, connected to a second generation signal, a second terminal, source or drain, connected to the controlled logic input signal, and its gate connected to a signal complementary to the non-controlled logic input signal;

the control signal generation circuit being configured to control the first generation signal and the second generation signal so that:

the first generation signal is in the low state during the charge phase and in the high state during the initialization and precharge phases of the counting period; and the second generation signal is in the high state during the initialization, precharge, and charge phases of the counting period;

the first generation signal and the second generation signal having a reset voltage during a reset period so as to bring the logic input signal to the reset voltage during a reset period.

8. The analog counter according to claim 1, wherein the control signal generation circuit is configured to transmit a clock signal to the transfer transistor having a limited amplitude so that the transfer transistor is not in ohmic mode during the precharge and charge phases.

9. The analog counter according to claim 1, wherein the reset circuit is formed by a transistor having its drain connected to the voltage across the integration capacitor, having its source is connected to an initialization voltage, and having its gate controlled by a reset signal generated by the control signal generation circuit.

10. The analog counter according to claim 1, wherein the injection capacitor and the integration capacitor are formed by MOS capacitors of same CMOS manufacturing technology.

* * * * *